United States Patent
Chen et al.

(10) Patent No.: US 12,255,165 B2
(45) Date of Patent: Mar. 18, 2025

(54) ELECTRONIC PACKAGE AND CARRIER THEREOF AND METHOD FOR MANUFACTURING THE SAME

(71) Applicant: SILICONWARE PRECISION INDUSTRIES CO., LTD., Taichung (TW)

(72) Inventors: Chi-Ren Chen, Taichung (TW);
Po-Yung Chang, Taichung (TW);
Pei-Geng Weng, Taichung (TW);
Yuan-Hung Hsu, Taichung (TW);
Chang-Fu Lin, Taichung (TW);
Don-Son Jiang, Taichung (TW)

(73) Assignee: SILICONWARE PRECISION INDUSTRIES CO., LTD., Taichung (TW)

(*) Notice: Subject to any disclaimer, the term of this patent is extended or adjusted under 35 U.S.C. 154(b) by 0 days.

(21) Appl. No.: 18/602,396

(22) Filed: Mar. 12, 2024

(65) Prior Publication Data
US 2024/0321798 A1 Sep. 26, 2024

Related U.S. Application Data

(62) Division of application No. 17/369,029, filed on Jul. 7, 2021, now Pat. No. 12,027,484.

(30) Foreign Application Priority Data

Jun. 3, 2021 (TW) .................................. 110120226

(51) Int. Cl.
*H01L 21/56* (2006.01)
*H01L 23/00* (2006.01)
*H01L 23/31* (2006.01)
*H01L 23/498* (2006.01)

(52) U.S. Cl.
CPC .............. *H01L 24/14* (2013.01); *H01L 21/56* (2013.01); *H01L 23/31* (2013.01); *H01L 23/49816* (2013.01); *H01L 23/49838* (2013.01); *H01L 23/562* (2013.01)

(58) Field of Classification Search
CPC ......... H01L 24/02; H01L 24/14; H01L 21/56; H01L 23/49816; H01L 23/49822
See application file for complete search history.

(56) References Cited

U.S. PATENT DOCUMENTS

| | | | |
|---|---|---|---|
| 11,676,887 B2 | 6/2023 | Jin et al. | |
| 2012/0061821 A1* | 3/2012 | Black | H01L 24/05 257/E21.585 |
| 2017/0365564 A1 | 12/2017 | Yu et al. | |
| 2018/0079939 A1 | 3/2018 | Kubota et al. | |
| 2019/0131221 A1 | 5/2019 | Lee et al. | |
| 2021/0125908 A1 | 4/2021 | Jang et al. | |
| 2022/0384208 A1 | 12/2022 | Chen et al. | |

* cited by examiner

*Primary Examiner* — Phat X Cao
(74) *Attorney, Agent, or Firm* — Studebaker Brackett PLLC

(57) ABSTRACT

An electronic package is provided and includes a carrier for carrying electronic components. Electrical contact pads of the carrier for planting solder balls are connected with a plurality of columnar conductors, and the conductors are electrically connected to a circuit portion in the carrier. By connecting a plurality of conductors with a single electrical contact pad, structural stress can be distributed and breakage of the circuit portion can be prevented.

7 Claims, 8 Drawing Sheets

ELECTRONIC PACKAGE AND CARRIER THEREOF AND METHOD FOR MANUFACTURING THE SAME

This is a divisional of co-pending U.S. Ser. No. 17/369,029, filed Jul. 7, 2021, which claims priority to Taiwan Application Serial No. 110120226, filed Jun. 3, 2021. The present disclosure relates to a semiconductor device, and more particularly, to an electronic package and a carrier thereof and a method for manufacturing the same.

BACKGROUND

1. Technical Field

2. Description of Related Art

The evolution of semiconductor packaging techniques has brought about the developments of various kinds of packages for semiconductor devices. In order to improve electrical function and reduce packaging space, different types of 3D packaging techniques have emerged, including, for example, Fan-Out Package-on-Packages (FO POP) to accommodate the increased amounts of I/O ports on various chips, thereby allowing integrated circuits of different functionalities to be incorporated into a single package structure. As such, electronic components with different functionalities, such as, memories, CPUs, GPUs, image application processors, etc., can be integrated into a system by stacking, which is ideal for light and compact electronic products.

As shown by a semiconductor package 1 in FIG. 1A, a plurality of semiconductor chips 11 are bonded onto a package substrate 10 via a plurality of solder bumps 13, and then the plurality of semiconductor chips 11 are encapsulated in an encapsulant 14, and solder balls 17 on electrical contact pads 100 on an underside of the package substrate 10 are attached onto a circuit board (not shown).

However, in the conventional semiconductor package 1, due to the material characteristics of the package substrate 10, during thermal cycles of the packaging process, the package substrate 10 may undergo thermal expansion and contraction and become deformed (as indicated by dashed lines in FIG. 1A), resulting in warpage of the package substrate 10. This tends to lead to stress concentrations and the occurrences of cracks or breaks between conductive blind vias 101 in the package substrate 10 and the electrical contact pads 100 (as shown in FIG. 1B).

Therefore, there is a need for a solution that addresses the aforementioned issues of the prior art.

SUMMARY

In view of the aforementioned shortcomings of the prior art, the present disclosure provides a carrier, which includes: a carrier body including an insulating portion and at least one circuit portion bonded to the insulating portion; a plurality of conductors embedded in the insulating portion and electrically connected with the circuit portion; and at least one electrical contact pad bonded to the insulating portion to connect with at least two of the plurality of conductors, wherein the insulating portion includes at least one dielectric layer, and wherein a plurality of opening regions are formed in the dielectric layer, and each of the conductors is formed in each of the opening regions.

The present disclosure further provides a method for manufacturing a carrier, which includes: forming a carrier body on a support, the carrier body including an insulating portion and at least one circuit portion bonded to the insulating portion, wherein a plurality of conductors are embedded in the insulating portion and electrically connected with the circuit portion, wherein the insulating portion includes at least one dielectric layer, and wherein a plurality of opening regions are formed in the dielectric layer, and each of the conductors is formed in each of the opening regions; removing the support; and forming at least one electrical contact pad on the insulating portion, wherein the electrical contact pad is connected to at least two of the plurality of conductors.

In the aforementioned carrier and method for manufacturing the same, the circuit portion includes a seed layer and a routing layer formed on the seed layer.

In the aforementioned carrier and method for manufacturing the same, the conductors are made of a metal material.

In the aforementioned carrier and method for manufacturing the same, the conductors are columnar.

In the aforementioned carrier and method for manufacturing the same, end faces and sides of the conductors are formed with a seed layer.

In the aforementioned carrier and method for manufacturing the same, the electrical contact pad covers at least two of the plurality of conductors via a seed layer.

In the aforementioned carrier and method for manufacturing the same, an upper surface of the dielectric layer and walls of the opening regions are formed with a seed layer.

The present disclosure further provides an electronic package, which includes: the aforementioned carrier, wherein the carrier body includes a first side and a second side opposite to the first side, and wherein the electrical contact pad is disposed on the second side of the carrier body; and an electronic component disposed on the first side of the carrier body and electrically connected with the circuit portion.

The present disclosure also provides a method for manufacturing an electronic package, which includes: providing the aforementioned carrier, wherein the carrier body includes a first side and a second side opposite to the first side, and wherein the electrical contact pad is disposed on the second side of the carrier body; and disposing an electronic component on the first side of the carrier body, wherein the electronic component is electrically connected with the circuit portion.

The aforementioned electronic package and method for manufacturing the same further include encapsulating the electronic component with an encapsulation layer.

The aforementioned electronic package and method for manufacturing the same further include forming a conductive component on the electrical contact pad.

As can be understood from the above, the electronic package and the carrier thereof and the method for manufacturing the same in accordance with the present disclosure employs the design of the plurality of conductors connecting with a single electrical contact pad, so that structural stress can be distributed and the circuit portion can be prevented from breaking. Thus, the carrier of the present disclosure is capable of increasing the overall structural strength to avoid or reduce problems in the conductors caused by warpage, thereby improving the reliability of the electronic package.

In addition, the configurations of the seed layers increase the thicknesses of the circuit portion, the conductors and/or the electrical contact pads, which allows the structural strength of the circuit portion, the conductors and/or the electrical contact pads to be enhanced. As a result, situations where thin circuits are damaged due to stress concentrations can be effectively mitigated.

BRIEF DESCRIPTION OF THE DRAWINGS

FIGS. 2A-2, 2A-3 and 2A-4 are schematic partial cross-sectional views illustrating a method for manufacturing a carrier body of FIG. 2A-1.

FIG. 2A-5 is a schematic partial cross-sectional view of FIG. 2A-1.

FIG. 2D-2 is a schematic partial cross-sectional view of FIG. 2D-1.

FIG. 2D-3 is a schematic partial top view of FIG. 2D-1.

DETAILED DESCRIPTION OF THE EMBODIMENTS

Figure 1A:
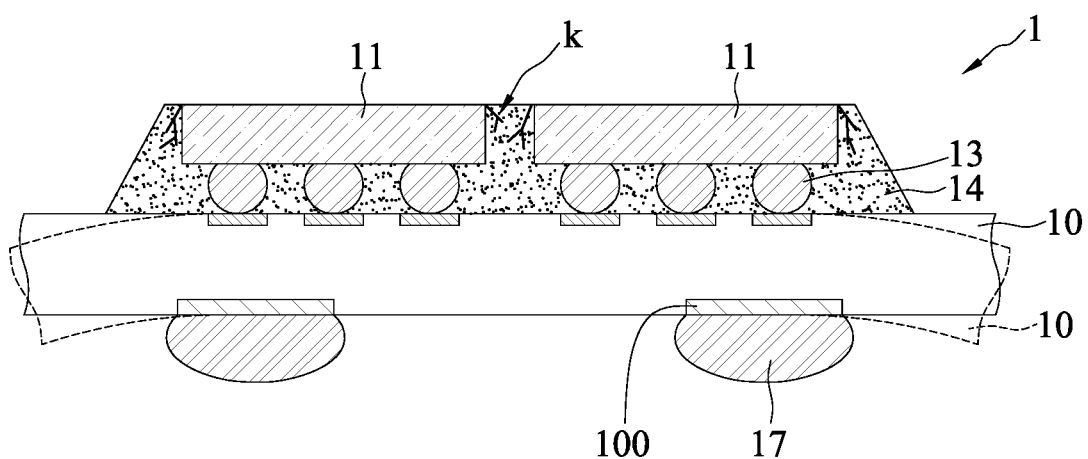
FIG. 1A is a schematic cross-sectional view of a conventional semiconductor package.
Figure 1B:
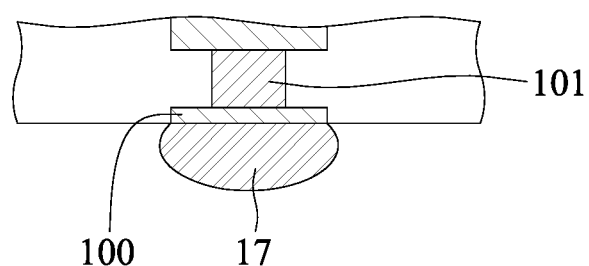
FIG. 1B is a schematic enlarged partial view of FIG. 1A.

Implementations of the present disclosure are illustrated using the following embodiments. One of ordinary skill in the art can readily appreciate other advantages and technical effects of the present disclosure upon reading the content of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Any modifications, changes or adjustments to the structures, ratio relationships or sizes, are to be construed as falling within the range covered by the technical content disclosed herein to the extent of not causing changes in the technical effects created and the objectives achieved by the present disclosure, Meanwhile, terms such as "above," "first," "second," "a," "an," and the like recited herein are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

FIGS. 2A-1, 2B, 2C, 2D-1 and 2E are schematic cross-sectional views illustrating a method for manufacturing an electronic package 2 in accordance with the present disclosure.

Figures 1, 2A:
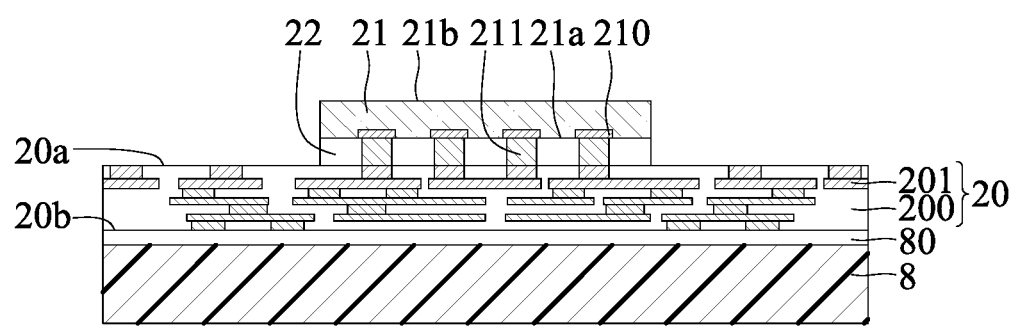
FIGS. 2A-1, 2B, 2C, 2D-1 and 2E are schematic cross-sectional views illustrating a method for manufacturing an electronic package in accordance with the present disclosure.

As shown in FIG. 2A-1, a carrier body 20 disposed on a support 8 is provided. The carrier body 20 includes a first side 20a and a second side 20b opposite to each other. At least one electronic component 21 is disposed on the first side 20a of the carrier body 20.

In an embodiment, the carrier body 20 is, for example, a package substrate having a core layer, a coreless package substrate, a through-silicon interposer (TSI) having through-silicon vias (TSVs) or other types of boards. The carrier body 20 includes an insulating portion 200 and at least one circuit portion 201 bonded to the insulating portion 200, such as a fan-out redistribution layer (RDL). It can be understood that the carrier body 20 can also be other types of chip-carrying substrates, such as a lead frame, a wafer, or other types of boards having metal routing, and the present disclosure is not limited to the above.

Furthermore, a coreless package substrate is used as an example of the carrier body 20, and can be manufactured by electroplating, wherein a dielectric layer is electroplated with a metal material via a seed layer on the support 8 to be used as patterned circuits. For example, the material of the dielectric layer is, an Ajinomoto build-up film (ABF), a photosensitive resin, polyimide (PI), bismaleimide triazine (BT), a FR-5 prepreg (PP), a molding compound, an epoxy molding compound (EMC), or other appropriate materials. The metal material (e.g., Ti, Cu, Ni, V, Al, W, Au or other compositions) can be formed by sputtering of the seed layer, but the present disclosure is not limited as such.

Figures 2, 2A:
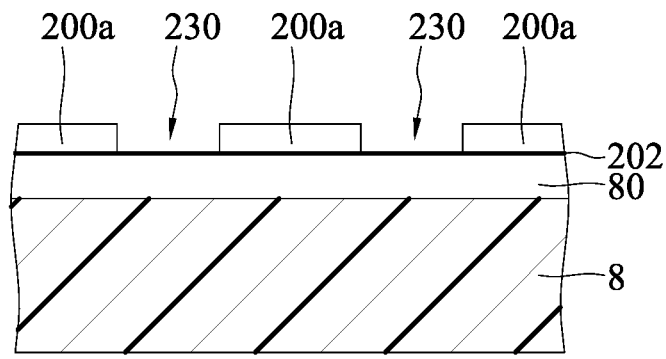
Figures 2, 2A, 3:
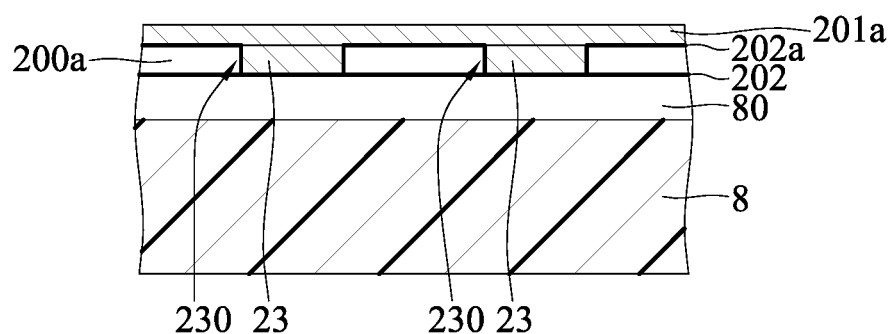
Figures 2, 2A, 3, 4:
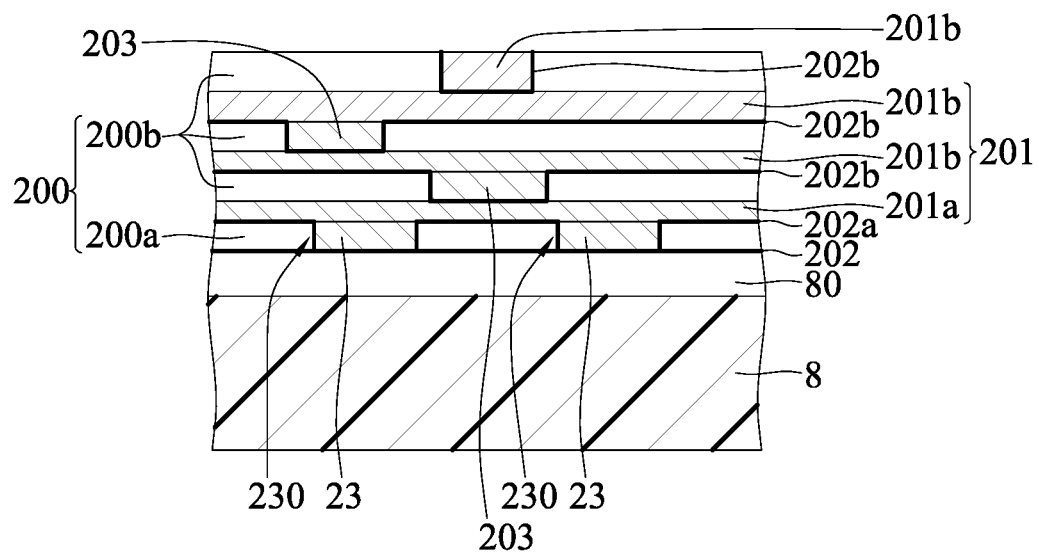
Figures 2, 2A, 3, 4, 5:
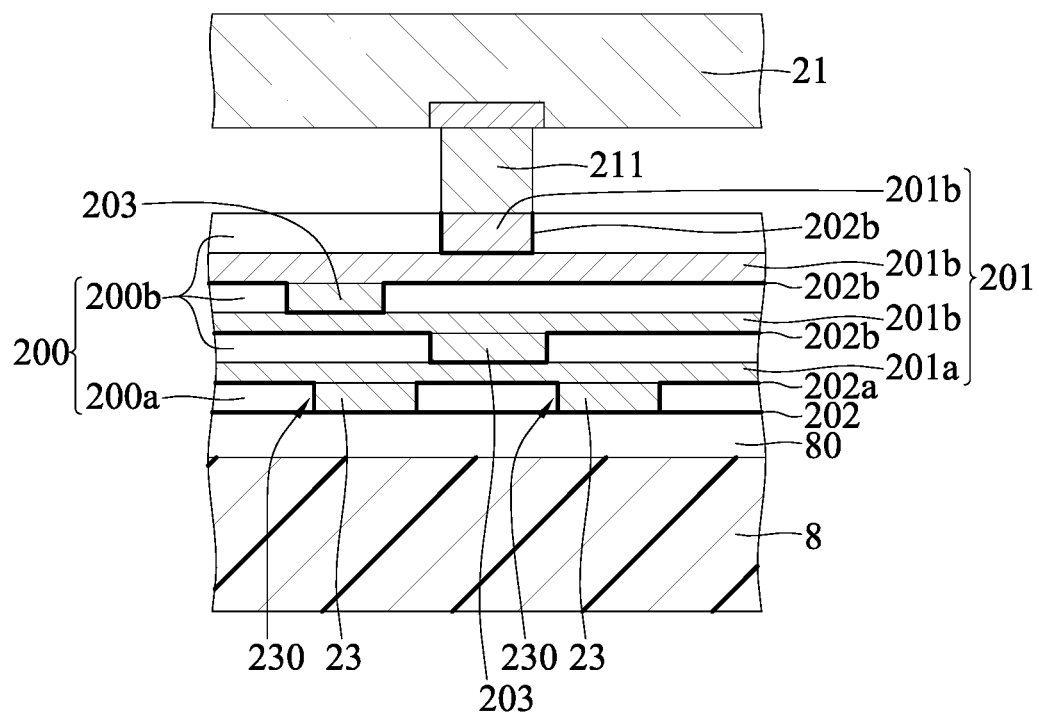

As shown in FIG. 2A-2, the manufacturing process of the carrier body 20 includes first forming an initial seed layer 202 on a bonding layer 80 of the support 8, and then a first dielectric layer 200a having patterned opening regions 230 is formed on the initial seed layer 202, such that portions of the surface of the initial seed layer 202 are exposed from the patterned opening regions 230. Next, as shown in FIG. 2A-3, a first seed layer 202a is formed on the first dielectric layer 200a and the initial seed layer 202 to facilitate the formation of a plurality of columnar conductors 23 in the patterned opening regions 230 through electroplating. A first routing layer 201a is then electroplated on the first dielectric layer 200a, such that the plurality of conductors 23 are electrically connected with the first routing layer 201a. Thereafter, as shown in FIG. 2A-4, at least a second dielectric layer 200b, a second seed layer 202b and a second routing layer 201b are sequentially formed in a build-up manner. As such, the second routing layer 201b is electrically connected with the first routing layer 201a via at least one conductive blind via 203 embedded in the second dielectric layer 200b and the second seed layer 202b formed on the second dielectric layer 200b and the first routing layer 201a (or another second routing layer 201b), wherein the first and second dielectric layers 200a and 200b can be regarded as the insulating portion 200, and the first seed layer 202a, the first routing layer 201a, the second seed layer 202b and the second routing layer 201b can be regarded as the circuit portion 201.

Moreover, the electronic component 21 can be an active component, a passive component or a combination of the above. The active component may be, for example, a semiconductor chip, and the passive component may be, for example, a resistor, a capacitor or an inductor. In an embodiment, as shown in FIG. 2A-5, the electronic component 21 is a semiconductor chip having an active face 21a and a non-active face 21b opposite to each other. The active face 21a includes a plurality of electrode pads 210. The electronic component 21 is disposed on the second routing layer 201b of the circuit portion 201 on the first side 20a of the carrier body 20 via a plurality of conductive bumps 211 (e.g., a solder material, metal pillars, etc.) by flip-chip bonding and is electrically connected with the circuit portion 201. The conductive bumps 211 are encapsulated by an insulating material 22, such as an underfill or a non-conductive film (NCF). Alternatively, the electronic component 21 can be electrically connected to the circuit portion 201 on the first side 20a of the carrier body 20 via a plurality of bonding wires (not shown) by wiring bonding. As yet another alternative, the electronic component 21 can be in direct contact with the circuit portion 201 on the first side 20a of the carrier body 20. Thus, electronic components of the required types and quantities can be attached on the carrier body 20 to improve the electrical functions. There are numerous ways in which the electronic component 21 can be electrically connected to the carrier body 20, and the present disclosure is not limited to the above.

Furthermore, the support 8 is, for example, a board made of a semiconductor material (e.g., silicon or glass), and a bonding layer 80 (a release film or other types of film) is formed by, for example, coating on the support 8. The bonding layer 80 serves as a sacrificial release layer.

Figure 2B:
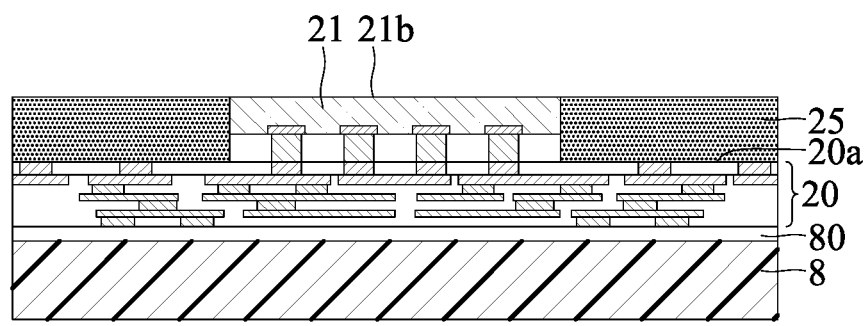

As shown in FIG. 2B, an encapsulation layer 25 is formed on the first side 20a of the carrier body 20 to encapsulate the electronic component 21 and the insulating material 22.

In an embodiment, the material forming the encapsulation layer 25 is an insulating material, such as, PI, a dry film, an epoxy resin, or a molding compound, etc., but the present disclosure is not limited as such. For example, the encapsulation layer 25 can be formed on the first side 20a of the carrier body 20 by lamination, molding, or the like.

Moreover, the encapsulation layer 25 covers the non-active face 21b of the electronic component 21. Alternatively, a planarization process can be performed as needed to allow the upper surface of the encapsulation layer 25 to be flush with the non-active face 21b and the non-active face 21b to be exposed from the encapsulation layer 25. For example, the planarization process includes removing portions of the encapsulation layer 25 through polishing.

Figure 2C:
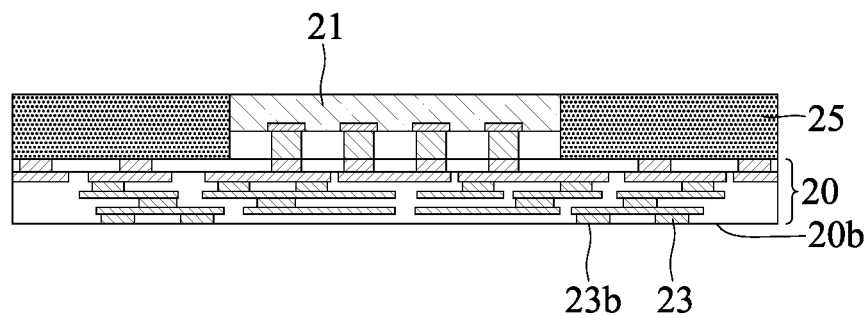

As shown in FIG. 2C, the support 8 and the bonding layer 80 thereon are removed to expose the second side 20b of the carrier body 20.

In an embodiment, after removing the support 8 and the bonding layer 80 thereon, the initial seed layer 202 on the second side 20b of the carrier body 20 is then removed to expose the lower end faces 23b of the conductors 23.

Figures 1, 2D:
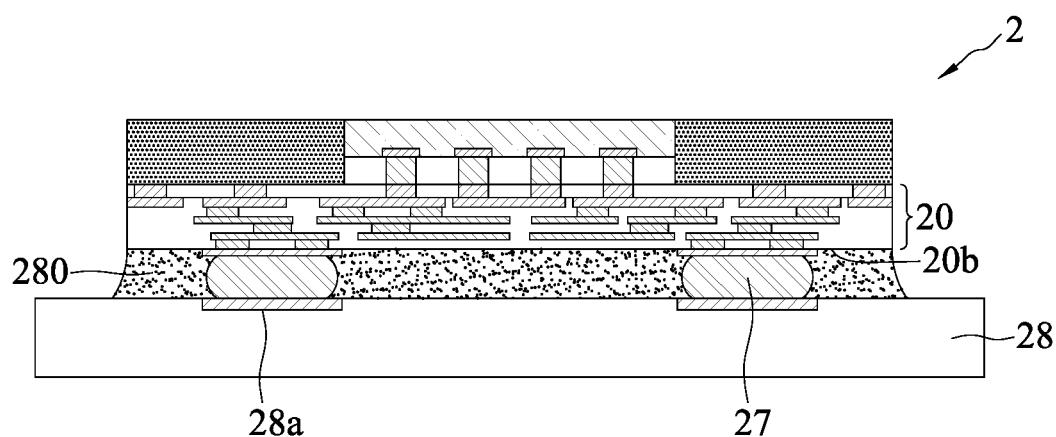
Figures 2, 2D:
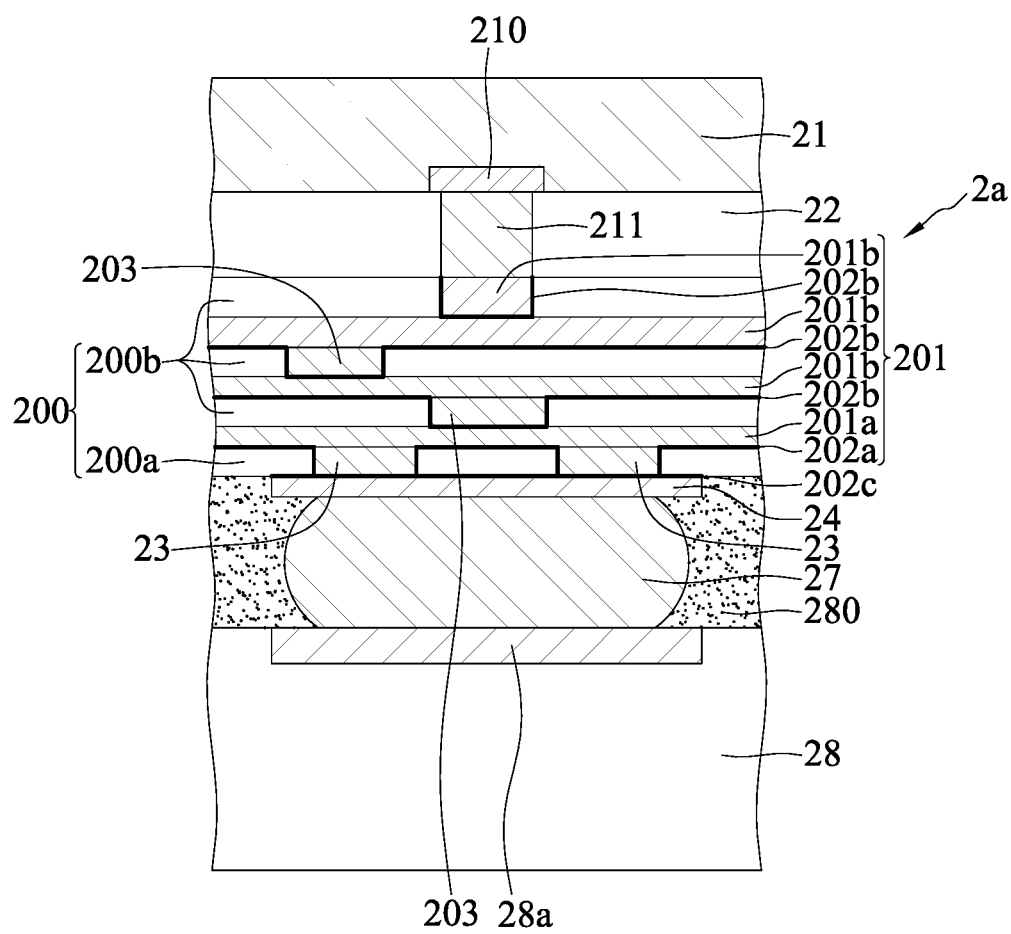
Figures 2, 2D, 3:
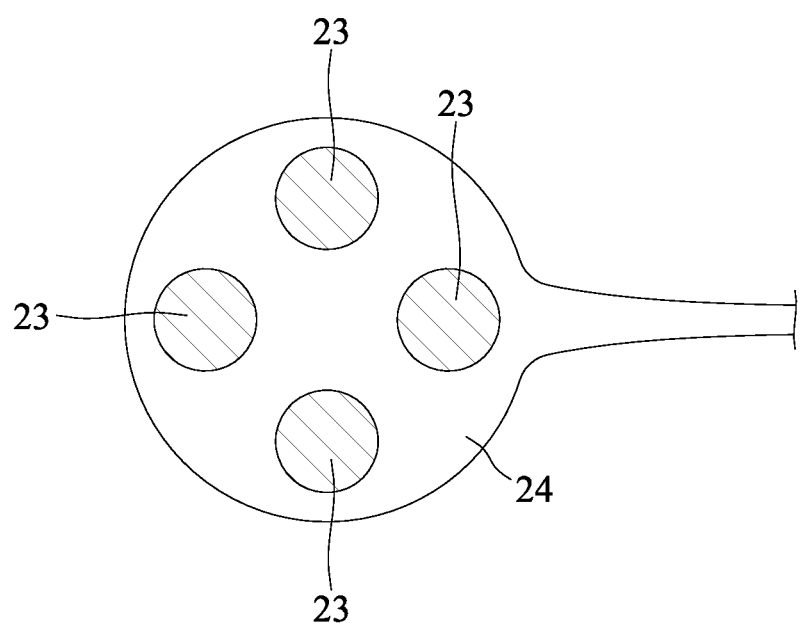

As shown in FIG. 2D-1, a plurality of C4 conductive components 27 (e.g., solder balls) are formed on the second side 20b of the carrier body 20 to be attached to contacts 28a of an electronic device 28 (e.g., a circuit board). An encapsulant 280 (e.g., an underfill) is formed on the electronic device 28 to encapsulate the conductive components 27.

In an embodiment, electrical contact pads 24 are electroplated on the second side 20b of the carrier body 20 via a third seed layer 202c as shown in FIG. 2D-2 to be bonded to the conductive components 27, wherein the carrier body 20, the electrical contact pads 24 and the plurality of conductors 23 constitute a carrier 2a (e.g., carrier structure).

Furthermore, a single electrical contact pad 24 is in contact with a plurality of conductors 23, such that the plurality of conductors 23 are vertically arranged in an array on the electrical contact pads 24 as shown in FIG. 2D-3, so that the first routing layer 201a can be electrically connected to the single electrical contact pad 24 via the plurality of conductors 23.

Figure 2E:
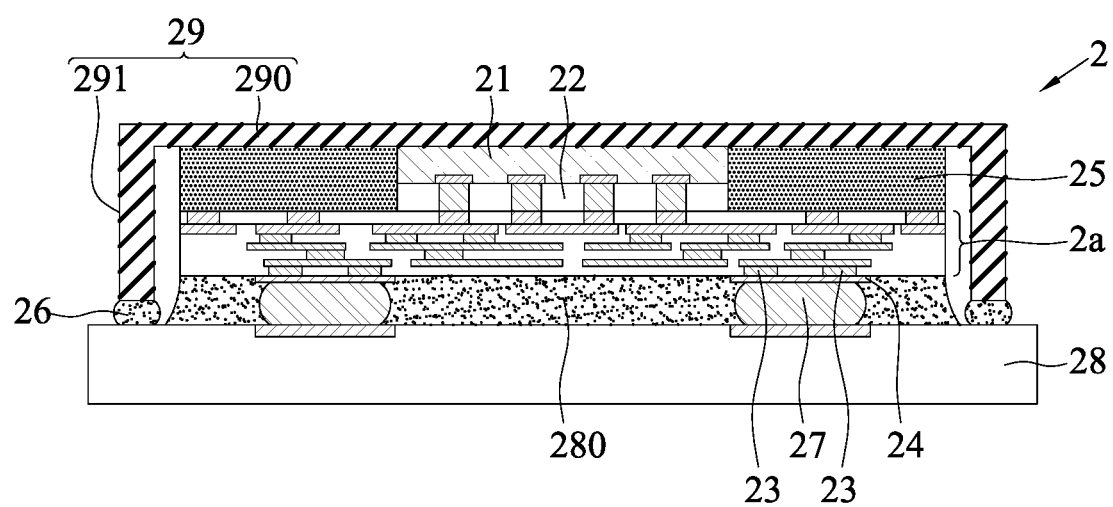

As shown in FIG. 2E, a heat-dissipating member 29 is provided on the electronic device 28, and the heat-dissipating member 29 is arranged to cover the electronic component 21, thereby forming the electronic package 2 in accordance with the present disclosure.

With the aforementioned manufacturing method, the electronic package 2 of the present disclosure includes: a carrier 2a, an electronic component 21 disposed on the carrier 2a, an encapsulation layer 25 encapsulating the electronic component 21, an electronic device 28 carrying the carrier 2a via a plurality of conductive components 27, and a heat-dissipating member 29 disposed on the electronic device 28 for dissipating heat from the electronic component 21.

In an embodiment, the heat-dissipating member 29 includes a heat-dissipating plate 290 and a plurality of supporting legs 291 extending downwards from the periphery of the heat-dissipating plate 290. A heat-dissipating material (not shown) on the underside of the heat-dissipating plate 290 is bonded onto the non-active face 21b of the electronic component 21. For example, the heat dissipating material is a thermal interface material (TIM), a solder material, a metal material, or other types of thermal conductive materials. When the non-active face 21b of the electronic component 21 is exposed from the encapsulation layer 25, the heat-dissipating plate 290 (or the heat-dissipating material) is in contact and bonded to the non-active face 21b of the electronic component 21.

Moreover, the supporting legs 291 can be bonded onto the electronic device 28 via an adhesive (or a thermal glue) 26 in order to secure the heat-dissipating member 29 in place.

Therefore, the manufacturing method of the present disclosure employs the opening regions 230 to separate the first dielectric layer 200a, so that structural stress would not be continuously concentrated in the insulating portion 200, thereby reducing the stress experienced by the circuit portion 201 and preventing the circuit portion 201 from breaking. Thus, compared to the prior art in which a single conductive blind via is connected to an electrical contact pad, the carrier 2a of the present disclosure is capable of ameliorating the issue of thin copper materials at the corners of the electrical contact pads 24 on the first dielectric layer 200a, while increasing the overall structural strength, and therefore, improving the reliability of the electronic package 2.

Moreover, the opening regions 230 are formed by leveraging the principle of stress break up, so the conductors 23 are capable of preventing or mitigating the issues of warpage. With each stress break-up points (i.e., the plurality of conductors 23) acting as control points for the degrees of freedom of the deformations of the carrier 2a, the directions of warpage can be appropriately compensated.

In addition, with the configurations of the first seed layer 202a, the second seed layer 202b and the third seed layer 202c, the thicknesses of the circuit portion 201, the conductors 23 and the electrical contact pads 24 are increased, thereby enhancing the structural strength of the circuit portion 201, the conductors 23 and the electrical contact pads 24. As a result, situations where thin circuits are damaged due to stress concentrations can be effectively mitigated.

Furthermore, the upper surface of the first dielectric layer 200a and the walls of the opening regions are formed with the first seed layer 202a, and/or the bottoms and sides of the conductors 23 are formed with seed layers (the first seed layers 202a and the third seed layers 202c).

The present disclosure also provides a carrier 2a, which includes a carrier body 20, a plurality of conductors 23 disposed in the carrier body 20, and at least one electrical contact pad 24 disposed on the carrier body 20.

The carrier body 20 includes an insulating portion 200 and at least one circuit portion 201 bonded to the insulating portion 200.

The conductors 23 are embedded in the insulating portion 200 and electrically connected with the circuit portion 201.

The electrical contact pad 24 is bonded to the insulating portion 200 to connect with a plurality of the conductors 23.

In an embodiment, the insulating portion 200 includes at least one dielectric layer (the first and second dielectric layers 200a and 200b), and a plurality of opening regions 230 are formed in the first dielectric layer 200a, and one conductor 23 is formed in each of the opening regions 230.

In an embodiment, the circuit portion 201 includes seed layers (first and second seed layers 202a and 202b) and routing layers (first and second routing layers 201*a* and 201*b*) formed on the seed layers.

In an embodiment, the conductors 23 are made of a metal material.

In an embodiment, the conductors 23 are columnar.

In an embodiment, end faces 23*b* and sides of the conductors 23 are formed with seed layers (the first seed layer 202*a* and the third seed layer 202*c*).

In an embodiment, the electrical contact pad 24 covers at least two of the plurality of conductors 23 via the third seed layer 202*c*.

In an embodiment, the upper surface of the first dielectric layer 200*a* and the walls of the opening regions are formed with the first seed layer 202*a*.

In conclusion, the electronic package and the carrier thereof and the method for manufacturing the same in accordance with the present disclosure employs the opening regions to break up the insulating portion, so that structural stress can be distributed and the circuit portion can be prevented from breaking. Thus, the carrier of the present disclosure is capable of increasing the overall structural strength to prevent or mitigate problems in the conductors caused by warpage, thereby improving the reliability of the electronic package.

In addition, the configurations of the seed layers increase the thicknesses of the circuit portion, the conductors and/or the electrical contact pads, which allows the structural strength of the circuit portion, the conductors and/or the electrical contact pads to be enhanced. As a result, situations where thin circuits are damaged due to stress concentrations can be effectively mitigated.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. A method for manufacturing a carrier, comprising:
   forming a carrier body on a support, the carrier body including an insulating portion and at least one circuit portion bonded to the insulating portion, wherein a plurality of conductors are embedded in the insulating portion and electrically connected with the circuit portion, wherein the insulating portion includes at least one dielectric layer, and wherein a plurality of opening regions are formed in the dielectric layer, and each of the conductors is formed in each of the opening regions, wherein an upper surface of the dielectric layer, walls of the plurality of opening regions and sides of the conductors are formed with a first seed layer;
   removing the support; and
   forming at least one electrical contact pad on the insulating portion, wherein the electrical contact pad covers at least two of the plurality of conductors via a second seed layer, and the second seed layer is in direct contact with end faces of the conductors.

2. The method of claim 1, wherein the circuit portion includes a third seed layer and a routing layer formed on the third seed layer.

3. The method of claim 1, wherein the conductors are made of a metal material.

4. The method of claim 1, wherein the conductors are columnar.

5. A method for manufacturing an electronic package, comprising:
   providing a carrier, comprising: a carrier body including an insulating portion and at least one circuit portion bonded to the insulating portion; a plurality of conductors embedded in the insulating portion and electrically connected with the circuit portion; and at least one electrical contact pad bonded to the insulating portion to connect with at least two of the plurality of conductors, wherein the insulating portion includes at least one dielectric layer, and wherein a plurality of opening regions are formed in the dielectric layer, and each of the conductors is formed in each of the opening regions, wherein an upper surface of the dielectric layer, walls of the plurality of opening regions and sides of the conductors are formed with a first seed layer, and wherein the electrical contact pad covers at least two of the plurality of conductors via a second seed layer, and the second seed layer is in direct contact with end faces of the conductors, wherein the carrier body includes a first side and a second side opposite to the first side, and wherein the electrical contact pad is disposed on the second side of the carrier body; and
   disposing an electronic component on the first side of the carrier body, wherein the electronic component is electrically connected with the circuit portion.

6. The method of claim 5, further comprising encapsulating the electronic component with an encapsulation layer.

7. The method of claim 5, further comprising forming a conductive component on the electrical contact pad.

* * * * *